United States Patent

Bartolini et al.

[11] 4,055,423
[45] Oct. 25, 1977

[54] ORGANIC MEDIUM FOR THIN-PHASE HOLOGRAPHY

[75] Inventors: Robert Alfred Bartolini, Trenton; Allen Bloom, East Windsor, both of N.J.

[73] Assignee: RCA Corporation, New York, N.Y.

[21] Appl. No.: 677,437

[22] Filed: Apr. 15, 1976

[51] Int. Cl.² ............................................. G03C 5/04
[52] U.S. Cl. ........................... 96/27 H; 96/115 R; 350/3.5
[58] Field of Search ............ 96/27 H, 35.1, 67, 115 R, 96/115 P; 350/3.5; 204/159.16

[56] References Cited

U.S. PATENT DOCUMENTS

| | | | |
|---|---|---|---|
| 3,580,657 | 5/1971 | Sheridon | 96/27 H |
| 3,658,526 | 4/1972 | Haugh | 96/27 H |
| 3,707,371 | 12/1972 | Files | 96/27 H |
| 3,764,333 | 10/1973 | Leclair et al. | 96/67 |
| 3,809,686 | 5/1974 | Chandross et al. | 96/27 H |
| 3,894,163 | 7/1975 | Broyde | 427/43 |
| 3,926,637 | 12/1975 | Bartolini et al. | 96/115 R |
| 3,951,663 | 4/1976 | Ross | 96/27 H |

*Primary Examiner*—Edward C. Kimlin
*Attorney, Agent, or Firm*—H. Christoffersen; Birgit E. Morris; Joseph T. Harcarik

[57] ABSTRACT

Permanent thin-phase holograms are recorded wherein the recording medium contains a recording layer comprised of an olefinically unsaturated negative photoresist polymer containing an α-diketone.

6 Claims, 2 Drawing Figures

ORGANIC MEDIUM FOR THIN-PHASE HOLOGRAPHY

This invention relates to a method for recording permanent thin-phase holograms. More particularly, this invention pertains to recording thin-phase holograms by changing the refractive index in a recording layer and detecting the refractive index changes, wherein the recording layer comprises an olefinically unsaturated negative photoresist polymer containing an α-diketone.

CROSS REFERENCES TO RELATED APPLICATIONS

This application discloses subject matter which is related to that disclosed in a copending application of A. Bloom, D. L. Ross, R. A. Bartolini, and L. K. Hung, entitled "Organic Volume Phase Holographic Recording Media," Ser. No. 661,521 filed Feb. 26, 1974.

BACKGROUND OF THE INVENTION

In U. S. Pat. No. 3,926,637 to Bartolini and Bloom which is incorporated by reference herein, permanent volume phase holographic recording is described wherein a hologram is recorded by changing the refractive index of selected areas of a recording medium with coherent light and detecting, also with coherent light, the refractive index changes. The volume phase recording media described comprises certain α-diketones which are dissolved in a transparent, cured acrylic polyester host. U.S. Pat. No. 3,951,663 to Ross which is incorporated by reference herein describes volume phase holographic recording media of α-diketones, dissolved in transparent, cured acrylic polyester or epoxy hosts. The copending application of A. Bloom, et al, referred to above and incorporated by reference herein describes volume phase holographic recording media wherein certain α-diketones are dissolved in sucrose benzoate as the host.

In volume phase recording the recording medium thickness is greater than the recording light wavelength such that the hologram is redundantly recorded in more than one plane in the recording medium. In thin phase recording media, a recording layer has a thickness on the order of the recording light wavelength, so that the hologram records only in one plane.

While the above-described recording media are useful for recording volume phase holograms, they have not been found practical as thin phase recording media.

Negative photoresist polymers containing the α-diketone benzil, have been described in U.S. Pat. Nos. 3,808,155, 3,865,597, and 3,894,163 to Broyde. In these patents information is recorded by the use of a scanning electron beam in a recording medium which is a negative photoresist. Unlike holographic recording which records with light by modulating the index of refraction in the recording medium, these patents describe recording with electron beams to produce a surface relief pattern in the recording medium. The disadvantages of electron beam-resist methods of recording are that large fluxes of electrons for proper exposure are required and the exposed recording media must be developed before the information can be read.

SUMMARY OF THE INVENTION

We have found that permanent thin-phase holograms can be recorded with modulated, coherent light by using as the recording medium a substrate layer and a recording layer affixed to the substrate layer wherein the recording layer is comprised of an olefinically unsaturated negative photoresist polymer containing certain α-diketones. This recording medium has excellent sensitivity.

DETAILED DESCRIPTION OF THE INVENTION

Figure 1:
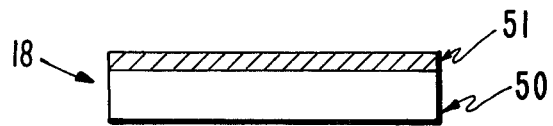
FIG. 1 is a cross sectional view of a recording medium of the invention.

Examples of suitable olefinically unsaturated negative photoresist polymers are KPR, KOR, and KMER, which are trademarked products of and available from the Eastman Kodak Company. The KPR is based on polyvinyl cinnamate; the KOR is based on polyvinyl cinnamylidene ester; and KMER is based on partially cyclized cis-polyisoprene. Further discussion of olefinically unsaturated negative photoresist polymers can be found in *Photoresist; Materials and Processes* by W. S. DeForest, McGraw Hill Book Co., N. Y. 1975 Ch 2.

The olefinically unsaturated negative photoresist polymer must be capable of dissolving the α-diketone employed, and it must be capable of transmitting coherent light at the wavelength utilized for recording and detecting the refractive index changes.

The α-diketones useful herein have the formula

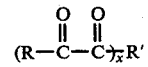

wherein R and R' independently can be methyl, a branched chain alkyl group or a cyclic hydrocarbon group wherein the carbon atoms are part of an aromatic or aliphatic ring or R and R' together can form part of an aromatic or aliphatic ring; and x is either 1 or 2. Illustrative of suitable α-diketones are benzil, 1,3- or 1,4-bis(phenylglyoxalyl)benzene, camphorquinone, 2,3-butanedione, 1-phenyl-1-1,2-propanedione and the like.

The negative photoresist containing the α-diketone is formed into a thin recording layer of less than 10 microns (μ) thickness and preferrably less than 2 microns (μ), onto a substrate layer. The substrate material can be any typical substrate material utilized for photographic or photoresist film such as glass, Mylar, a polyethylene terephthalate trademarked product available from the duPont Co., and the like provided the substrate has good adhesion to the photoresist layer of the instant invention.

The choice of α-diketone, negative photoresist, concentration of α-diketones in the negative photoresist, and the substrate depends upon several factors: the wavelength that the negative photoresist is designed for; the solubility of the α-diketone in the unexposed negative photoresist; the molecular weight of the α-diketone; the absorption spectrum of the α-diketone and the wavelength region used during recording and readout; and the thickness or the recording medium. The α-diketone will be chosen so that its absorption band is close to the recording wavelength. The concentration of the α-diketone in the negative photoresist polymer is suitably from about 1 to 30 weight percent and preferrably from about 5 to 20 weight percent and the concentration of the negative photoresist polymer is generally from about 70 to 99 weight percent and preferrably from 80 to 95 weight percent with the concentrations of the α-diketone and negative photoresist polymer totaling 100 percent.

The recording media are prepared by dissolving the α-diketone in a solution of an organic solvent containing generally from about 3 to 20 grams of negative photoresist per 100 cc of solution. The resulting solution is then applied to a suitable substrate layer such as a glass plate. A uniform thin layer of photoresist containing the α-diketone is obtained by such standard techniques as spinning, dipping, spraying and the like. When spinning is employed, spinning rates of 400 to 9000 rpm are generally used. Next the substrate is baked at about 80° C for several minutes generally about 5 to 30 minutes, to drive off the organic solvent. This will produce recording layers less than 10 μ and preferrably less than 2 μ in thickness.

FIG. 1 is an illustration of a thin-phase holographic recording medium 18 wherein a substrate layer 50 has a recording layer 51 thereon.

Figure 2:
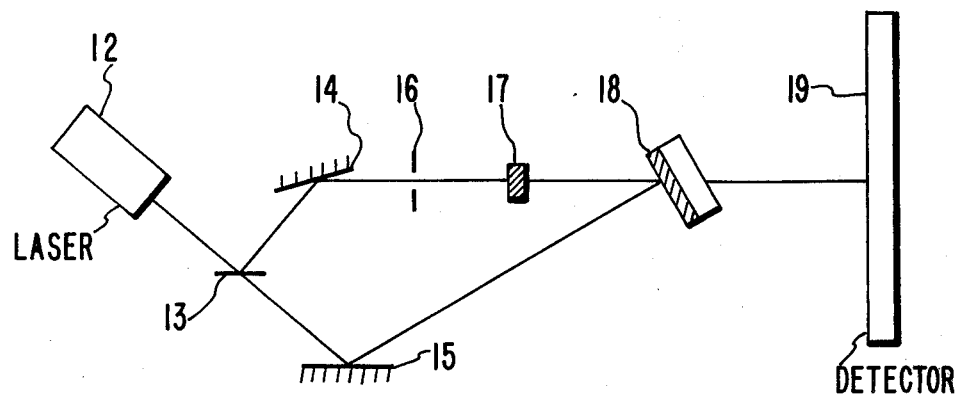
FIG. 2 is a schematic diagram of an apparatus suitable for recording thin-phase holograms.

FIG. 2 is a schematic diagram of an apparatus useful for recording and readout of holographic information in the recording media described above.

Referring now to FIG. 2, the apparatus includes a laser 12 which emits a coherent light beam of a certain wavelength. The light beam passes through a beam splitter 13. A portion of the beam is reflected from the beam splitter 13 onto a first mirror 14; the remainder of the light beam passes through onto a second mirror 15. The mirrors 14 and 15 are adjusted so that the plane polarized beams reflected from them meet at a predetermined angle, such as 30°-45°. The portion of the beam reflected from the beam splitter 13 is the object beam. The object beam passes through a shutter 16 and then through the object to be recorded 17. The portion of the beam which passes through the beam splitter 13 is the reference beam. The recording medium 18 is positioned at the intersection of the reference and object beams. During readout, the shutter 16 is closed and only the reference beam passes through to the recording medium. The image can be viewed on a detector screen 19.

The invention will be further illustrated by the following examples, but it is to be understood that the invention is not meant to be limited to the details described therein.

EXAMPLE 1

One tenth gram of camphorquinone was added to ten milliliters of KOR solution. The KOR solution contained polyvinyl cinnamylidene ester with about 9.5 weight percent solids in an organic solvent. The camphorquinone/KOR solution was then applied to one side of a 1 inch (2.54 cm) by one inch (2.54 cm) glass substrate. The glass substrate was then spun so that the camphorquinone/KOR solution formed a thin uniform solution layer. Next the glass plate containing the solution layer was baked at a temperature of 80° C for 20 minutes to remove the solvent. The recording layer on the glass substrate was about 1 micron thick.

Holograms were recorded using an apparatus according to FIG. 2 utilizing a laser which emitted light having a wavelength of 4,880 angstroms. Laser incident exposure of 100 millijoules per centimeter$^2$ produced a hologram having a diffraction efficiency of 10 percent.

EXAMPLE 2

In this example the same procedure as in EXAMPLE 1 was followed except that KPR was used rather than KOR. The KPR solution contained polyvinyl cinnamate with about 7.1 weight percent solids in an organic solvent. After a 100 millijoules per centimeter$^2$ exposure at 4,880 angstroms, a hologram having an 8 percent diffraction efficiency was recorded.

EXAMPLE 3

This example is presented as a control to show that a thin-phase holographic recording medium prepared by using an olefinically unsaturated negative photoresist polymer without an α-diketone has little utility as a holographic recording medium. The same procedure as EXAMPLE 1 was used except that the thin-phase holographic medium was prepared using KOR with no camphorquinone added. The diffraction efficiency of the recorded hologram after a 100 millijoule per centimeter$^2$ exposure at 4,880 angstroms was only 0.05% as compared to 10 percent in EXAMPLE 1.

EXAMPLE 4

This example is also presented as a control. The same procedure as EXAMPLE 3 was used except that KPR instead of KOR was used without camphorquinone as the thin-phase recording medium. After an exposure of 100 millijoules per centimeter$^2$ at 4,880 angstroms, no recorded hologram could be detected.

EXAMPLE 5

This example is additionally presented as a control. The same procedure as EXAMPLE 1 was used except that a positive photoresist resin rather than an olefinically unsaturated negative photoresist resin was used. The positive photoresist used in this example was Shipley AZ-1350, available from the Shipley Company.

This photoresist is believed to be a complex mixture of a diester diazide of the structure.

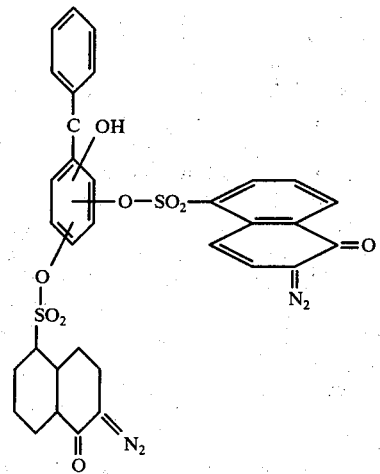

in admixture with the corresponding monester and triester byproducts, combined with a cresolformaldehydenovolac resin.

After exposure of 100 millijoules per centimeter$^2$ at 4,880 angstroms, a hologram with a diffraction efficiency of less than 1 percent was observed.

EXAMPLE 6

This example is also presented as a control. The same procedure as EXAMPLE 3 employed except that Shipley AZ-1350 photoresist was used rather than KOR without the addition of camphorquinone. After an exposure of 100 millijoules per centimeter$^2$ at 4,880 angstroms, the same results were obtained as in EXAMPLE 5. Thus the addition of an $\alpha$-diketone such as camphorquinone to a positive working photoresist did not have any beneficial effects as a thin-phase holographic recording medium.

We claim:

1. A method for recording permanent thin-phase holograms wherein holograms are recorded in only one plane which comprises changing with coherent light and without further development processing the refractive index in selected areas of a recording medium and detecting with coherent light the refractive index changes wherein the recording medium comprises a substrate having a recording layer thereon wherein the recording layer comprises an olefinically unsaturated negative photoresist polymer containing a soluble $\alpha$-diketone which has the formula

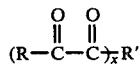

wherein R and R' independently are selected from the group consisting of methyl, branched chain alkyl and cyclic hydrocarbon groups wherein the carbon atoms are part of an aromatic or aliphatic ring and R and R' together can form part of an aromatic or aliphatic ring; and $x$ is an integer of 1 to 2.

2. A method according to claim 1 wherein the $\alpha$-diketone is camphorquinone.

3. The method according to claim 1 wherein the olefinically unsaturated negative photoresist polymer is based on polyvinyl cinnamate.

4. The method according to claim 1 wherein the olefinically unsaturated negative photoresist polymer is based on polyvinyl cinnamylidene ester.

5. The method according to claim 1 wherein the weight percent of the $\alpha$-diketone is from about 1 to 30 percent and the weight percent of the negative photoresist polymer is from about 70 to 99 percent with the weight percent of the $\alpha$-diketone and the negative photoresist polymer totaling 100 percent.

6. The method according to claim 1 wherein the weight percent of the $\alpha$-diketone is from about 5 to 20 percent and the weight percent of the negative photoresist polymer is from 80 to 95 percent with the weight percent of the $\alpha$-diketone and the negative photoresist polymer totaling 100 percent.

* * * * *